US009159383B2

(12) United States Patent
Hendrickson

(10) Patent No.: US 9,159,383 B2
(45) Date of Patent: Oct. 13, 2015

(54) SIGNAL MANAGEMENT IN A MEMORY DEVICE

(75) Inventor: Nicholas Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 855 days.

(21) Appl. No.: 13/443,913

(22) Filed: Apr. 11, 2012

(65) Prior Publication Data

US 2013/0272073 A1   Oct. 17, 2013

(51) Int. Cl.
*G11C 7/10* (2006.01)
*G11C 7/22* (2006.01)
*G11C 8/06* (2006.01)

(52) U.S. Cl.
CPC *G11C 7/109* (2013.01); *G11C 7/22* (2013.01); *G11C 8/06* (2013.01); *G11C 7/10* (2013.01)

(58) Field of Classification Search
CPC ............ G11C 7/109; G11C 7/22; G11C 7/10; G11C 8/06
USPC ....................... 365/189.05, 189.011, 191, 195
See application file for complete search history.

(56) References Cited

U.S. PATENT DOCUMENTS

| 4,602,353 | A | 7/1986 | Wawersig et al. |
| 5,185,719 | A | 2/1993 | Dhong et al. |
| 5,404,335 | A | 4/1995 | Tobita |
| 5,892,730 | A | 4/1999 | Sato et al. |
| 6,084,818 | A | * | 7/2000 | Ooishi ..................... 365/230.03 |
| 6,442,645 | B1 | 8/2002 | Freker |
| 8,089,820 | B2 | * | 1/2012 | Park et al. ..................... 365/193 |

* cited by examiner

Primary Examiner — Toan Le
(74) Attorney, Agent, or Firm — Dicke, Billig & Czaja, PLLC

(57) ABSTRACT

Command signal management methods and circuits in memory devices are disclosed. Command signals are selectively passed and blocked to enforce safe operating characteristics within a memory device. In at least one embodiment, a command signal management circuit is configured to selectively block a command signal while a memory device operation is being performed. In at least one other embodiment, one or more command blocking circuits are configured to selectively pass and block one or more command signals generated by a memory access device coupled to the memory device while a memory device operation is being performed in the memory device.

32 Claims, 3 Drawing Sheets

SIGNAL MANAGEMENT IN A MEMORY DEVICE

TECHNICAL FIELD

The present disclosure relates generally to memory and in particular, in one or more embodiments, the present disclosure relates to management of signals in memory devices.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and Flash memory.

Non-volatile memory is memory that can retain its stored data for some extended period without the application of power. Flash memory devices have developed into a popular source of non-volatile memory for a wide range of electronic applications. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Flash memory devices typically require relatively large voltages for programming and erasing operations. For example, a Flash memory device may have a supply voltage (e.g., Vcc) of 3V but require a voltage (e.g., Vpgm) of 15V or higher to be used during programming and/or erase operations on the array of memory cells. However, a sense (e.g., read) operation of Flash memory might only require voltages of Vcc or less, for example.

The demand for higher operating speeds and greater storage capacity in memory devices continues to increase. This demand is accompanied by a need for a reduction in the latency of signals propagating within memory devices in order to facilitate the desired increase in operating speed. However, along with a reduction in latency is the increased possibility of undesirable operating characteristics of a memory device if the various signals propagating in the memory device are not managed properly. For example, unintentionally generating program voltages during a read operation may cause undesirable results in the operation of the memory device.

For the reasons stated above, and for other reasons stated below which will become apparent to those skilled in the art upon reading and understanding the present specification, there is a need in the art for signal management circuits to facilitate the safe operation of non-volatile memories.

DETAILED DESCRIPTION

Figure 1:
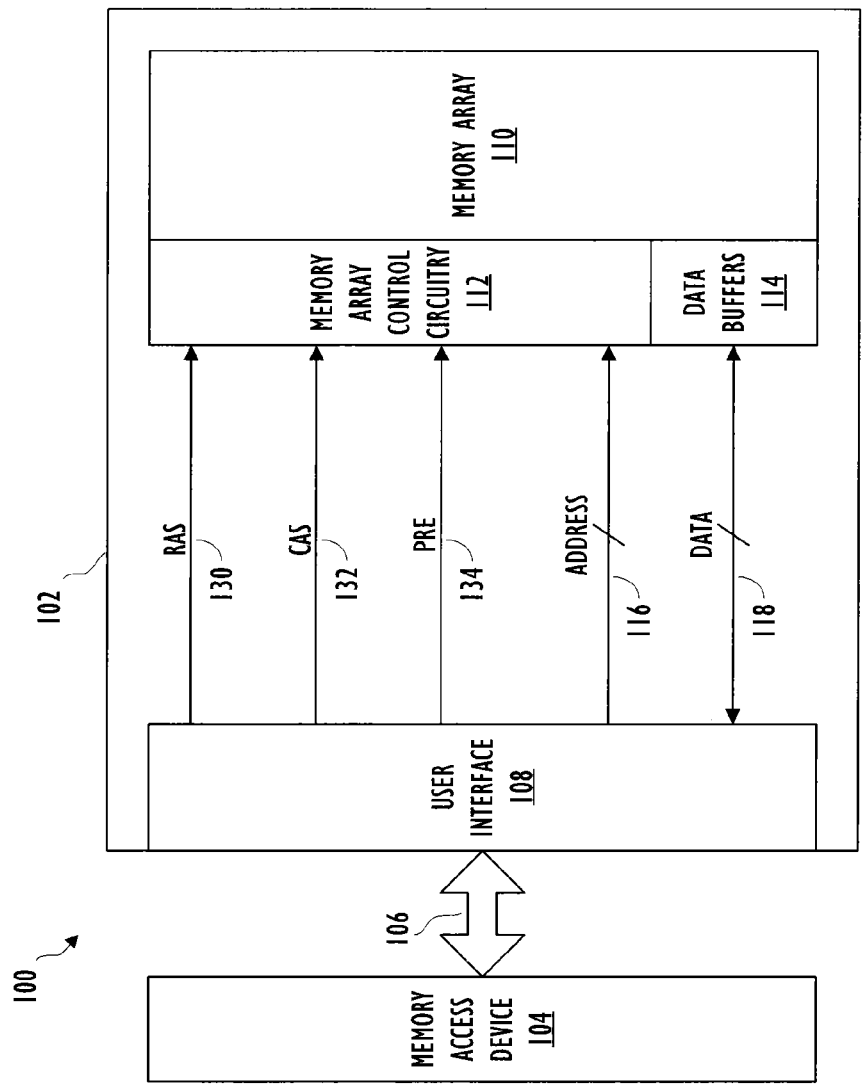
FIG. 1 is a simplified block diagram of a typical memory device coupled to a memory access device as part of an electronic system.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. In NOR Flash architecture, a logical column of memory cells is coupled in parallel with each memory cell coupled to a data line, such as those typically referred to as digit (e.g., bit) lines. In NAND Flash architecture, a column of memory cells is coupled in series with only the first memory cell of the column coupled to a bit line. Control gates of memory cells comprising a row of memory cells are coupled to access lines, such as those typically referred to as word lines.

In a typical Flash memory array, each selected memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional charge storage cell by assigning a bit pattern to a specific $V_t$ range.

Programming Flash memory cells typically involves applying one or more programming pulses (Vpgm) to a selected word line coupled to one or more selected memory cells. Typical programming pulses (Vpgm) start at or near 15V and tend to increase in magnitude with each programming pulse application. During a programming operation, a potential, such as a ground potential (e.g., 0V), is applied to the substrate of the array, and thus to the channels of the selected memory cells. This results in a charge transfer from the channel to the charge storage structures of memory cells selected for programming. For example, floating gates are typically charged through direct injection or Fowler-Nordheim tunneling of electrons from the channel to the floating gate, resulting in a $V_t$ typically greater than zero in a programmed state. A Vpass potential is applied to unselected word lines and might be 10V, for example. The Vpass potentials are not high enough to cause programming of memory cells biased to a Vpass potential. Performing a sense (e.g., read) operation on one or more selected memory cells of the memory array typically requires applying voltages to the selected memory cells which are typically at or below Vcc, such as 3V, for example.

FIG. 1 illustrates a simplified block diagram of a typical memory device 102 coupled to a memory access device 104 as part of an electronic system 100. The memory access device 104 might be a processor or some other type of controlling circuitry. A memory device interface 108 (e.g., user interface) of the memory device 102 is coupled to the memory access device 104 over one or more communications channels 106 (e.g., communications bus.) The communications bus might comprise command, address and/or data signal lines. The user interface 108 might comprise a number of standard interfaces, such as a Universal Serial Bus (USB) interface, for example. The user interface 108 might be a standard interface used with many hard disk drives (e.g., SATA, PATA) as are known to those skilled in the art. Together, the memory device 102, memory access device 104 and the communications bus 106 form part of the electronic system 100.

Memory device 102 further comprises an array of memory 110, such as an array of Flash memory cells, for example. Memory device operations to be performed on the memory array 110 are facilitated by memory array control circuitry 112. These memory device operations might comprise programming (e.g., writing), erasing and sensing operations, for example. The memory array control circuitry 112 is further coupled to the user interface 108 by an address bus 116. Memory device 102 further comprises data buffers 114 which are coupled to the user interface 108 by a data bus 118. The data bus 118 might be a bi-directional data bus, for example. The address bus 116 and data bus 118 allow for access to the memory array, such as part of a read, write and/or erase operation to be performed on the memory array.

The user interface 108 is further coupled to the memory array control circuitry 112 by command signal lines Row Address Strobe (RAS) 130, Column Address Strobe (CAS) 132 and Precharge Strobe (PRE) 134. Commands generated to initiate specific memory device operations (e.g., read, write and erase operations) are transferred from the user interface 108 to the memory array control circuitry 112 over one or more of the RAS 130, CAS 132 and PRE 134 command signal lines. State machines (not shown) comprising the memory array control circuitry 112 respond to the commands transmitted over the RAS 130, CAS 132 and PRE 134 command lines. For example, a particular state machine within the memory array control circuitry 112 might facilitate performing a read operation in the memory array 110. If the state machine is provided enough time to complete the desired read operation, a successful (e.g., error free) read operation will typically occur.

However, as the demand for increased operating speeds and lower latency memory devices continues to increase, there exists an increased likelihood that a particular state machine might not complete facilitating its corresponding memory device operation before another command is received by the memory array control circuitry 112. Receiving this additional command may initiate another memory device operation within the memory array control circuitry 112 before the first memory device operation has completed. This presents the potential for one or more undesirable events to occur within the memory device. For example, a high potential (e.g., program potential Vpgm) might be unintentionally generated and applied to one or more memory cells of the memory array during a read operation that has not yet been completed. The command signals (e.g., RAS, CAS and PRE signals) may be generated responsive to the memory access device 104 requesting a second memory device operation while a first memory device operation is still being performed on the array of memory of the memory device. This may lead to corruption of data and/or possibly damage to the memory device.

Further, undesirable potentials (e.g., glitches) might appear on the command lines (e.g., RAS 130, CAS 132 and PRE 134 command lines) as a result of coupling effects with other signals propagating within the memory device. These glitches might be interpreted by the memory array control circuitry 112 as legitimate commands to initiate a state machine operation. These unintentionally generated command signals (e.g., glitches or noise) may lead to corruption of data and possibly permanent damage to portions of the memory array itself. Thus, one or more embodiments of the present disclosure provide circuits and facilitate command signal management methods to facilitate safe operation of memory device operations performed in a memory device.

Figure 2:
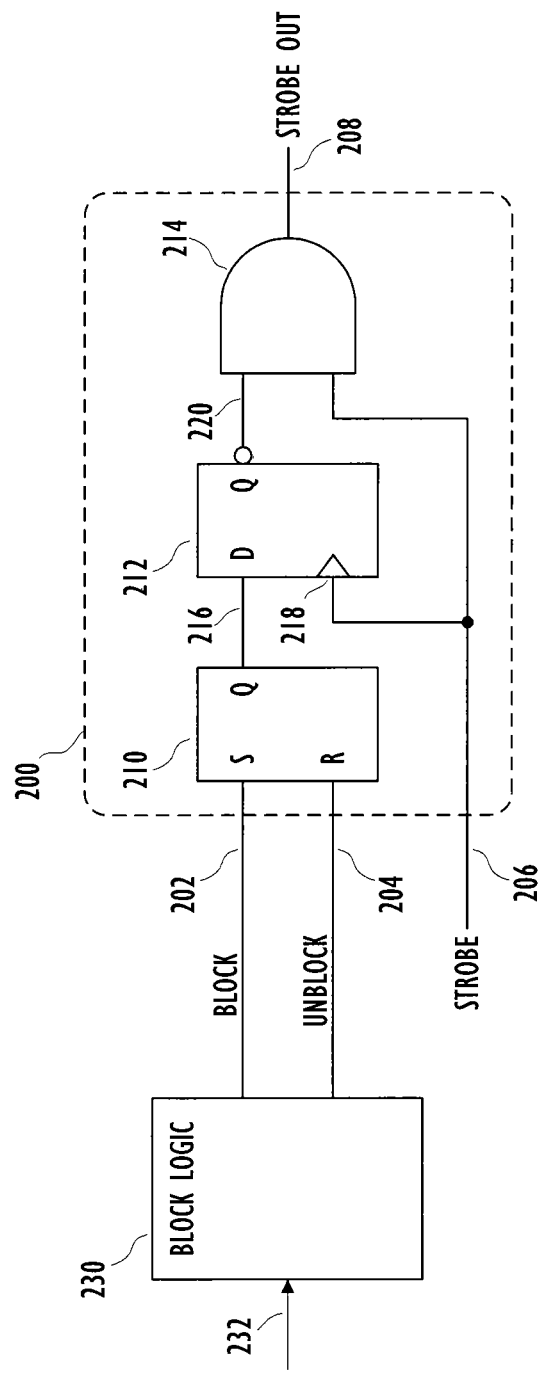
FIG. 2 is schematic representation of a signal management circuit according to an embodiment of the present disclosure.

FIG. 2 illustrates a schematic representation of a command signal management circuit 200 according to one or more embodiments of the present disclosure. The command signal management circuit 200 comprises an 'SR latch' (i.e., Set-Reset latch) 210 which stores a status (e.g., block or unblock) of whether an upcoming strobe signal (e.g., command signal) is to be permitted to pass through the command signal management circuit and propagate into memory array control circuitry (not shown in FIG. 2) of the memory device. The use of an SR latch 210 enables the command signal management circuit to operate in either a strobe based or level based mode of operation. Whether the S (i.e., Set) or R (i.e., Reset) side of the SR latch 210 is dominant can be significant. According to one or more embodiments the Block side (e.g., Set) 202 of the SR latch might take precedence, for example.

The output Q of the SR latch 210 is coupled 216 to an input of a D latch 212. The D latch 212 operates in a flow-through mode while the D latch input 218 coupled to the STROBE signal line 206 is in an idle state, such as having a logic '0' level, i.e., a logic low level, for example. When the STROBE 206 signal goes active (e.g., transitions to a logic '1' level, i.e., a logic high level), the current status of Block 202 or Unblock 204 is latched in the D latch 212 to prevent any further updates while the strobe signal 206 is active. This is important to prevent both 'glitches' and/or 'runt' strobes on the STROBE signal line 206 from violating subsequent setup/hold timings. A 'runt' strobe might comprise a pulse on a signal line that fails to fully transition from a logic low level to a logic high level before returning back to a logic low level, for example. The output Q of the D latch 212 is coupled 220 to a first input of a logical AND gate 214. The STROBE signal line 206 is coupled to a second input of the AND gate 214. The output of the AND gate 208 drives the STROBE OUT signal line 208. The STROBE signal line 206 might be coupled to a user interface of a memory device (not shown in FIG. 2). A signal applied to the STROBE signal line 206 might be a RAS, CAS or PRE command signal provided from the user interface of the memory device, for example.

The STROBE OUT signal line 208 can be coupled to an input of the memory array control circuitry (not shown in FIG. 2) of the memory device according to one or more embodiments of the present disclosure. This allows the output state of the D latch 212 (e.g., logic low level) to block a signal (e.g., strobe signal) propagating on the STROBE signal line 206 from being received by the memory array control circuitry if the memory array control circuitry is not ready to receive it. For example, the output Q of the D latch 212 coupled 220 to the input of the AND gate 214 might have a logic low level to ensure that the STROBE OUT signal line 208 is held at a logic low level regardless of the state of the STROBE signal line 206. Thus, any signals present (e.g., a steady state logic high level or strobe pulse) on the STROBE signal line 206 is blocked from propagating to the memory array control circuitry when the output Q of the D latch 212 is at a logic low level. Thus, an interruption to a memory device operation currently being performed might be avoided due to blocking signals present on the STROBE signal line 206. A logic high level on the output Q of D latch 212 coupled 220 to the AND gate "unblocks" a logic high level (e.g., steady state or strobe pulse) from passing through the AND gate and thus may be received by the memory array control circuitry, such as after completing the prior memory device operation, for example.

Thus, the states of the BLOCK 202 and UNBLOCK 204 signal lines are managed to facilitate safe operating conditions within the memory device according to various embodiments of the present disclosure. For example, the logic levels (e.g., logic high or low levels) of the BLOCK 202 and UNBLOCK 204 signal lines might be maintained by Block Logic circuitry 230 configured to drive the BLOCK 202 and UNBLOCK 204 signal lines to particular combinations (e.g., patterns) of logic levels. Block Logic 230 might comprise various logic circuitry (not shown) which is configured to drive the BLOCK 202 and UNBLOCK 204 signal lines responsive to one or more input signals provided on input 232. The various logic circuitry (not shown) comprising the block logic circuit 230 might comprise a single logic component, such as a buffer, inverter, AND gate, NOR gate or NAND gate, for example. Although the various embodiments according to the present disclosure are not limited to comprising these logic gates. The various logic circuitry of the block logic 230 might comprise a combination of these or other logic gates such as known to those skilled in the art.

Input 232 is shown in FIG. 2 as a single input signal line. However, the input 232 might comprise multiple signal lines according to various embodiments of the present disclosure. The one or more signals provided on input 232 might be generated by memory device control circuitry, such as the memory array control circuitry (not shown in FIG. 2.) For example, when a particular memory device operation is being performed, the memory array control circuitry might drive one or more of the inputs 232 to particular logic levels (e.g., combination of logic high levels and/or logic low levels) to maintain the desired logic levels of the BLOCK and UNBLOCK signal lines until the particular memory device operation is completed.

Figure 3:
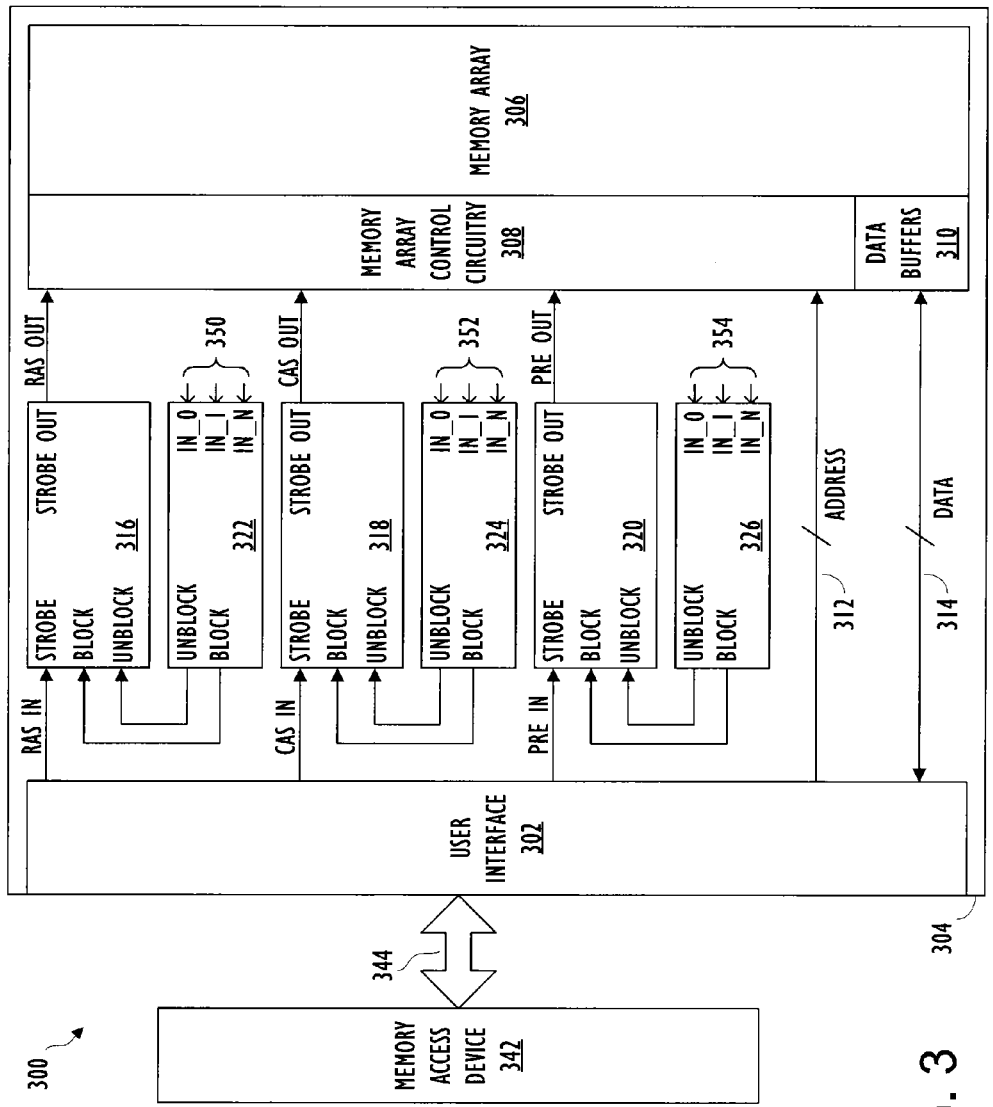
FIG. 3 is a simplified block diagram of a memory device coupled to a memory access device as part of an electronic system according to an embodiment of the present disclosure.

FIG. 3 illustrates a simplified block diagram of a memory device 304 coupled to a memory access device 342 as part of an electronic system 300 according to various embodiments of the present disclosure. The memory device 304 comprises a memory device (e.g., user) interface 302. The user interface 302 might be coupled to a communications bus 344 which might be coupled to a memory access device (e.g., processor) 342 as part of the electronic system 300, for example.

The memory device 304 further comprises an array of memory cells 306. The array of memory cells 306 might comprise an array of Flash memory cells having a NAND configuration or a NOR configuration, for example. Memory array control circuitry 308 is configured to facilitate one or more memory device operations within the memory array, such as read, program and/or erase operations in the memory array 306. The memory array control circuitry might comprise one or more state machines, for example. Memory array control circuitry 308 is coupled to the user interface 302 by an address bus 312. Thus, the user interface 302 can transfer an address to the memory array, control circuitry 308 over the address bus 312, such as an address corresponding to a read and/or program operation to be performed, for example. The address bus 312 might comprise one or more signal lines, for example.

Memory device 304 further comprises data buffer circuitry 310. Data buffer circuitry 310 may be configured to receive and/or transfer data across the DATA bus 314, such as between the user interface 302 and the data buffers 310. The DATA bus 314 might comprise one or more signal lines and might comprise a bi-directional data bus, for example. Although shown as a single bus, the DATA bus 314 might comprise two or more data busses (e.g., DATA IN bus, DATA OUT bus.) Data buffers 310 are configured to receive data to be written to the memory array 306 from the user interface 302 across the DATA bus 314. Data buffers 310 can also store data obtained from the memory array 306, such as from performing a read operation on the memory array, for example. The data buffers 310 can subsequently transfer the data obtained from the memory array 306 to the user interface 302, for example.

Memory device 304 further comprises one or more command signal management circuits 316-320, such as discussed above with respect to FIG. 2, for example. Although three command signal management circuits 316-318 are shown in FIG. 3, various embodiments of the present disclosure are not so limited. By way of example, the three command signal management circuits 316-320 are configured to manage a RAS, CAS and PRE command signal which might be generated by the user interface 302. Each command signal management circuit 316-320 is shown coupled to a corresponding block logic associated with the corresponding command signal management circuit. For example, the RAS command signal management circuit 316 is shown coupled to the RAS block logic 322, the CAS command signal management circuit 318 is shown coupled to the CAS block logic 324, and the PRE command signal management circuit is shown coupled to the PRE block logic 326. The signal lines 350-354 coupled to the RAS block logic 322, CAS block logic 324 and PRE block logic, respectively might comprise signal lines 232 coupled to the block logic 230 discussed above with respect to FIG. 2, for example. Although the signal lines 350-354 are shown in FIG. 3 as inputs IN_0 through IN_N, the various embodiments are not so limited. Each of the signal lines of 350-354 might share one or more signal lines as an input and/or each of the signal lines 350-354 might comprise a different number of signal lines (not shown), for example.

Each block logic 322-326 comprises logic circuitry configured to determine an appropriate 'Block/Unblock' status for the corresponding command signal management circuit at any particular time during operation of the memory device 304. However, the particular logic circuitry comprising each block logic 322-326 might be different from one or more of the other block logic circuits of the memory device. Logic comprising the CAS block logic 324 might be different than logic comprising the PRE block logic 326, for example. Thus, each block logic may be configured differently to facilitate to generate the desired 'block/unblock' operating characteristics of each corresponding command signal management circuit.

Command signals (e.g., steady state signals or strobe pulses), such as RAS, CAS and/or PRE command signals, are transferred from the user interface 302 to one or more of the command signal management circuits 316-320. Based on a status (e.g., logic level) of the block logic outputs, SR latches, D latches and logic gates of the command signal management circuits, the command signals might propagate through the command management signal circuits (e.g., with a single AND gate delay) or can be blocked from being received by the memory array control circuitry according to various embodiments of the present disclosure.

By way of example, a read operation might be initiated in the memory array 306 responsive to one or more command signals received by the memory array control circuitry 308 from one or more of the command signal management circuits 316-320. While the read operation is being performed, additional command signals which might be generated within the memory device can be selectively blocked from being received by the memory array control circuitry 308 until the current read operation has been completed. This can avoid interrupting the current read operation and/or initiating another memory device operation. Upon completion of the read operation, command signals might be selectively unblocked by the one or more command signal management circuits 316-320 and thus can be received by the memory array control circuitry, such as to initiate another memory device operation, for example.

CONCLUSION

Memory devices having command signal management circuits and methods of operating such memory devices have been described. In particular, non-volatile memory devices comprising command signal management circuits, for example might be operable to manage command signals within memory devices to enforce safe operating modes and timing of memory device operations. Memory device commands might be managed by selectively blocking and/or unblocking particular command signals within the memory device to enforce specific timing characteristics of operating modes within the memory devices.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device having an array of memory cells, the method comprising:
   performing a first memory device operation on the array of memory cells responsive to control circuitry of the memory device receiving a first command signal from an interface of the memory device; and
   inhibiting a second command signal from being received by the control circuitry prior to the control circuitry completing the first memory device operation.

2. The method of claim 1, wherein inhibiting the second command signal further comprises inhibiting the second command signal by blocking the second command signal from propagating on a signal line coupled between the interface and the control circuitry of the memory device.

3. The method of claim 2, wherein blocking the second command signal further comprises blocking the second command signal by inhibiting a transition of the signal line from a first logic level to a second logic level.

4. The method of claim 2, wherein blocking the second command signal further comprises blocking the second command signal by inhibiting a change in a potential of the signal line coupled between the interface and the control circuitry.

5. The method of claim 2, wherein inhibiting the second command signal further comprises inhibiting the second command signal by blocking the transfer of the second command signal at a particular point along the signal line coupled between the interface and the control circuitry.

6. The method of claim 1, wherein inhibiting the second command signal further comprises inhibiting the second command signal by interrupting the second command signal from propagating on a signal line coupled between the interface and the control circuitry of the memory device.

7. The method of claim 1, wherein the second command is indicative of a command to initiate a second memory device operation to be performed on the array of memory cells.

8. The method of claim 7, wherein inhibiting the second command signal further comprises inhibiting the second command signal to inhibit initiating the second memory device operation in the memory device.

9. The method of claim 1, wherein inhibiting a second command signal from being received by the control circuitry further comprises inhibiting the second command from being transferred on a signal line coupled between the interface and the control circuitry.

10. The method of claim 9, wherein inhibiting the second command signal further comprises inhibiting the second command signal by interrupting the transfer of the second command signal at a particular point along the signal line coupled between the interface and the control circuitry.

11. A method of operating a memory device having an array of memory cells, the method comprising:
    performing a first memory device operation on the array of memory cells responsive to control circuitry of the memory device receiving a first command from an interface of the memory device, wherein the first command corresponds to one of a plurality of memory device operations; and
    selectively blocking the control circuitry from receiving one or more second commands from the interface until the first memory device operation is complete, wherein the one or more second commands correspond to one or more of the plurality of memory device operations.

12. The method of claim 11, further comprising unblocking the control circuitry from receiving the one or more second commands upon completion of the first memory device operation.

13. The method of claim 12, further comprising performing a second memory device operation on the array of memory cells after unblocking the control circuitry from receiving the one or more second commands and responsive to the control circuitry receiving the one or more second commands.

14. The method of claim 11, wherein the first command and the one or more second commands are different commands.

15. The method of claim 11, wherein the first memory device operation is different than the second memory device operation.

16. The method of claim 11, wherein blocking the control circuitry from receiving the one or more second commands further comprises blocking the one or more second commands from propagating on a signal line coupled between the interface and the control circuitry.

17. The method of claim 16, wherein the first command is received by the control circuitry on the signal line prior to blocking the one or more second commands from propagating on the signal line.

18. The method of claim 16, wherein blocking the control circuitry from receiving the one or more second commands further comprises blocking the one or more second commands from propagating on a different signal line coupled between the interface and the control circuitry.

19. The method of claim 11, wherein the first command and the one or more second commands comprise a command indicative of the same memory device operation to be performed on the array of memory cells.

20. A signal management circuit, comprising:
    a first input node;
    a second input node;
    a third input node;
    a signal management circuit output node;
    a gate comprising a first gate input, a second gate input and gate output, wherein the first gate input is coupled to the third input node and where the gate output is coupled to the signal management circuit output node;

a first latch circuit, wherein a first input of the first latch circuit is coupled to the first input node and where a second input of the first latch circuit is coupled to the second input node; and a second latch circuit;

wherein a first input of the second latch circuit is coupled to an output of the first latch circuit;

wherein a second input of the second latch circuit is coupled to the third input node; and wherein an output of the second latch circuit is coupled to the second gate input.

21. The signal management circuit of claim 20, wherein the first latch comprises an SR type latch, the second latch comprises a D type latch, and where the gate comprises a logic AND gate.

22. The signal management circuit of claim 20, wherein the signal management circuit output is configured to output a logic level comprising the same logic level as a logic level of the third input node when a logic level of the first input node and a logic level of the second input node comprise a first pattern of logic levels.

23. The signal management circuit of claim 22, wherein the signal management circuit output is configured to output a constant logic level regardless of a change in a logic level of the third node when a logic level of the first input node and a logic level of the second input node comprise a second pattern of logic levels, where the first pattern of logic levels is different than the second pattern of logic levels.

24. A memory device, comprising:
an array of memory cells;
a memory device interface;
one or more signal management circuits; and
control circuitry, wherein the control circuitry is configured to perform a first memory device operation on the array of memory cells responsive a first command signal transferred from the interface and received by the control circuitry;
wherein the one or more signal management circuits are each configured to inhibit a second command signal from being received by the control circuitry prior to the control circuitry completing the first memory device operation performed responsive to the control circuitry receiving the first command signal.

25. The memory device of claim 24, further comprising one or more signal lines coupled between the memory device interface and the control circuitry.

26. The memory device of claim 25, wherein the one or more signal management circuits are configured to selectively couple one or more of the one or more signals lines from the memory device interface to the control circuitry.

27. The memory device of claim 24, wherein at least one of the signal management circuits comprises:
a first input node;
a second input node;
a third input node;
a signal management circuit output node;
a gate comprising a first gate input, a second gate input and gate output, wherein the first gate input is coupled to the third input node and where the gate output is coupled to the signal management circuit output node;
a first latch circuit, wherein a first input of the first latch circuit is coupled to the first input node and where a second input of the first latch circuit is coupled to the second input node; and
a second latch circuit;
wherein a first input of the second latch circuit is coupled to an output of the first latch circuit;
wherein a second input of the second latch circuit is coupled to the third input node; and
wherein an output of the second latch circuit is coupled to the second gate input.

28. The memory device of claim 27, wherein the first latch comprises an SR type latch, the second latch comprises a D type latch, and where the gate comprises a logic AND gate.

29. The memory device of claim 27, wherein a signal management circuit output node of each of the one or more signal management circuits is coupled to the control circuitry.

30. The memory device of claim 24, wherein the memory device interface is configured to communicate with a memory access device coupled to the memory device interface.

31. The memory device of claim 24, wherein the control, circuitry comprises one or more state machines.

32. A memory device, comprising:
a memory device interface;
an array of memory cells;
one or more command signal management circuits; and
control circuitry, wherein the control circuitry is configured to perform a first memory device operation on the array of memory cells responsive to receiving a first command signal from the memory device interface, and to perform a second memory device operation on the array of memory cells responsive to receiving a second command signal from the memory device interface;
wherein at least one command signal management circuit is configured to block the control circuitry from receiving the second command signal while the control circuitry performs the first memory device operation; and
wherein at least one command signal management circuit is configured to block the control circuitry from receiving the first command signal while the control circuitry performs the second memory device operation.

* * * * *